(12) United States Patent
Stokkermans

(10) Patent No.: US 7,677,523 B2
(45) Date of Patent: Mar. 16, 2010

(54) GRAVITY COMPENSATION DEVICE FOR A CHIP TRANSFER APPARATUS

(75) Inventor: Joep Stokkermans, Nijmegen (NL)

(73) Assignee: NXP B.V., Eindhoven (NL)

( * ) Notice: Subject to any disclaimer, the term of this patent is extended or adjusted under 35 U.S.C. 154(b) by 641 days.

(21) Appl. No.: 11/628,127

(22) PCT Filed: May 23, 2005

(86) PCT No.: PCT/IB2005/051666

§ 371 (c)(1),
(2), (4) Date: Nov. 28, 2006

(87) PCT Pub. No.: WO2005/116487

PCT Pub. Date: Dec. 8, 2005

(65) Prior Publication Data

US 2008/0061275 A1    Mar. 13, 2008

(30) Foreign Application Priority Data

May 28, 2004    (EP)    .................... 04102403

(51) Int. Cl.
*F16H 19/00* (2006.01)
*B23Q 11/00* (2006.01)
*H01L 21/00* (2006.01)

(52) U.S. Cl. ............... 248/572; 248/123.11; 248/123.2; 248/332; 271/160; 267/74

(58) Field of Classification Search ................ 248/572, 248/592, 597, 648, 579, 665, 123.11, 123.2, 248/125.2, 292.11, 328, 329, 332, 331, 330.1; 271/214, 160, 219; 267/74; 74/592, 517; 73/866.4

See application file for complete search history.

(56) References Cited

U.S. PATENT DOCUMENTS

| 2,178,122 | A |   | 10/1939 | Ostler et al. |
| 2,480,865 | A |   | 9/1949 | Lofstrand |
| 4,524,965 | A | * | 6/1985 | Kulpa ........................ 271/214 |
| 4,544,121 | A | * | 10/1985 | Komura ..................... 248/331 |
| 4,685,648 | A |   | 8/1987 | Dobner et al. |
| 4,768,762 | A |   | 9/1988 | Lund et al. |
| 5,207,110 | A |   | 5/1993 | Chew et al. |
| 6,434,851 | B1 | * | 8/2002 | Nishina ........................ 33/559 |
| 6,474,637 | B1 | * | 11/2002 | Spall et al. .................. 271/160 |
| 6,691,960 | B2 | * | 2/2004 | Metelski .................. 248/123.2 |

FOREIGN PATENT DOCUMENTS

| FR | 1 065 707 | 5/1954 |
| FR | 2 619 602 | 2/1989 |
| GB | 767 539 | 2/1957 |
| JP | 01 248005 | 10/1989 |

* cited by examiner

*Primary Examiner*—Anita M King

(57) ABSTRACT

A gravity compensation device partially or completely compensates a force exerted by a basic mass (10) on a balancing device (12) at a first distance from an axis of rotation (13) by using a force generating device, such as spring (14), exerting a counterforce on the balancing device at a second distance from the axis of rotation. The first distance, the second distance, or both are selectable for providing the desired gravity compensation. One or more pulleys with an angle-variable radius may be used. The gravity compensation device does not add substantial mass to the basic mass, and is simple in design.

18 Claims, 3 Drawing Sheets

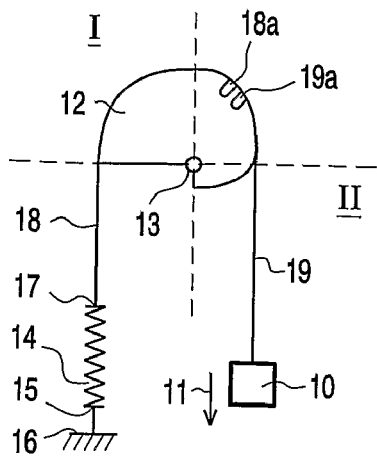
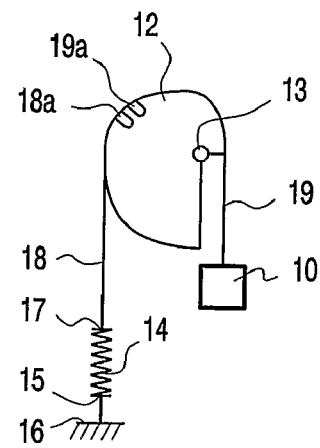
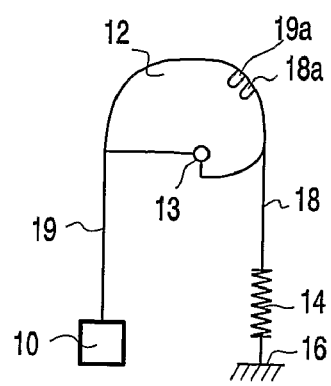
FIG. 1a  FIG. 1b  FIG. 1c
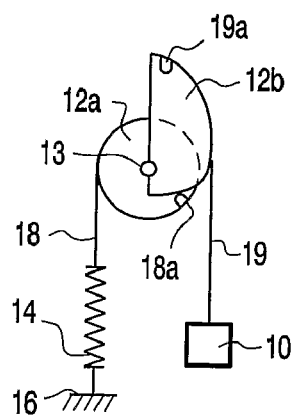
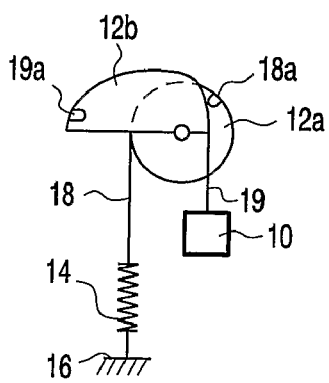
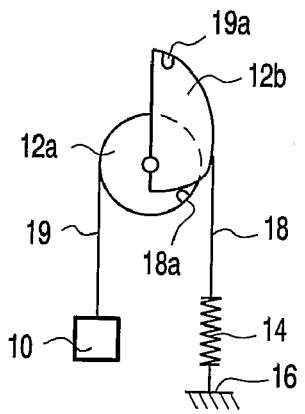
FIG. 2a  FIG. 2b  FIG. 2c
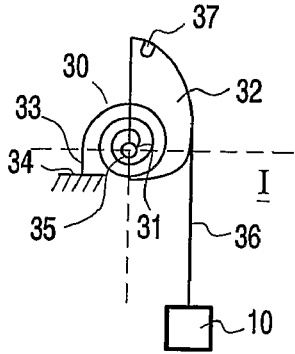
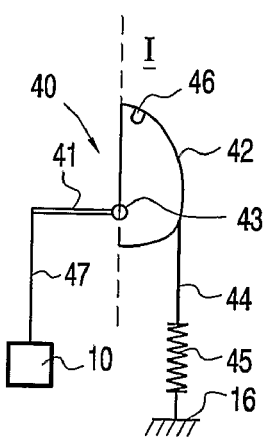
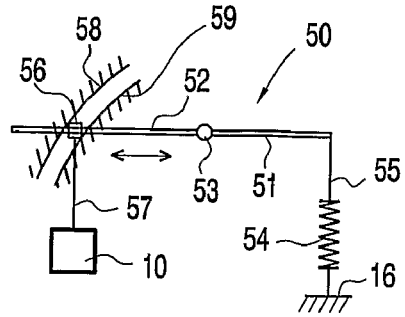
FIG. 3  FIG. 4  FIG. 5

GRAVITY COMPENSATION DEVICE FOR A CHIP TRANSFER APPARATUS

The present invention relates to a gravity compensation device.

In different kinds of equipment, when moving a mass in the common gravity field, compensation of the force of gravity operating on the mass is advantageous. At least partially compensating the force of gravity by a force counteracting this force of gravity allows for the use of relatively low forces for moving the mass, and may lead to energy savings when compared to the situation where gravity compensation is absent. Further, the safety of the movement of the mass may be enhanced by gravity compensation, i.e. the loss of an external force on the at least partially gravity-compensated mass will not lead to an undesirably high acceleration of the mass, and may even lead to no acceleration at all.

In the prior art, a first type of gravity compensation comprises a mass-balanced system. Essentially, in such a system a basic mass for which the gravity is to be compensated is connected to a counter mass in a balance system. The balance system may e.g. comprise a (possibly multiple) pulley with a wire, cable, chain, belt or the like, or a pivotable or otherwise movable arm, or a plurality of interconnected arm elements, etc. An example of a mass-balanced system can be found in a conventional elevator where an elevator cabin is connected to a balance mass by cables via a pulley mechanism to compensate the (average) basic mass of the elevator cabin.

A first drawback of a mass-balanced system is the increase in mass to be moved: not only the basic mass for which the gravity is to be compensated, but also the counter mass and the added mass of the balance system must be accelerated and decelerated when moving the basic mass, requiring an increased amount of energy.

A second drawback of a mass-balanced system is the increased mechanical complexity of the system, resulting inter alia in a deterioration of its dynamic mechanical behavior. As an example, when a large mass is to be moved with a high degree of accuracy in a short time using a high performance actuator, such as a servomechanism, a control system for the actuator may be faced with parasitic frequencies and a bad settling behavior, such that a required dynamic performance cannot be met.

In the prior art, a second type of gravity compensation comprises a spring-balanced system. Basically, the force of gravity acting on a basic mass is counteracted by a spring force in a balance system. The balance system may e.g. comprise a (possibly multiple) pulley with a wire, cable, chain, belt or the like, or a pivotable or otherwise movable arm, or a plurality of interconnected arm elements, etc.

A first drawback of a spring-balanced system is that the compensation of the force of gravity will only be perfect at one (equilibrium) position of the basic mass, since the generated spring force varies in accordance with the effective length and/or torsion of the spring, where the relationship between the length or torsion of the spring and the force generated thereby may be linear or non-linear. Thus, an actuator moving the basic mass will have to generate an additional negative or positive force in any position other than the equilibrium position. Generally, a spring-balanced system will be biased such that always an additional force in one direction is necessary to move the mass and to keep the mass at a certain position. Generating additional forces generally leads to increased power consumption of the actuator, even when the basic mass is at rest.

A second drawback of a spring-balanced system is the serious risk arising in case of an actuator failure, where the basic mass may be catapulted by the spring.

It is an object of the invention to provide a gravity compensation device featuring a simple design, yet being extremely effective in its gravity compensating capabilities without adding substantial mass to the overall gravity compensated system.

According to the invention, at least this object is reached by a gravity compensation device for compensating at least part of the force of gravity acting on a basic mass, the gravity compensation device comprising: a balancing system comprising an axis of rotation and a balancing device being rotatable around the axis of rotation, and being configured to be connected to the basic mass at a first predetermined distance from the axis of rotation for generating a first moment relative to the axis of rotation in a first rotational direction; and a force generating device having a first terminal configured to be connected to the balancing device at a second predetermined distance from the axis of rotation for generating a second moment relative to the axis of rotation in a second rotational direction opposite to the first direction, the force generating device having a second terminal configured to be connected to a reference position, wherein for different angular positions of the balancing device the first predetermined distance and the second predetermined distance are selected such that the first moment and the second moment have a predetermined relationship.

In the device according to the invention, the first and the second predetermined distance in principle are the shortest distances between a (possibly fictitious) working line of the force applied by the basic mass and the force generating device, respectively, and the axis of rotation. The first and the second predetermined distance may be chosen such that, as a function of the angular position of the balancing device, the basic mass is kept in perfect equilibrium by the force generating device over an operating range or distance, and will not move when no force other than the force of gravity and a force generated by the force generating device are active. Of course, it is also possible not to completely compensate for the force of gravity acting on the basic mass, such that the basic mass will, in the absence of forces other than the force of gravity and the force generated by the force generating device, move to a predetermined position in a controlled way.

The basic mass may be moved along a vertical line, or in any other non-horizontal direction, i.e. at an angle between 0° and 90° relative to the vertical line. When moving the basic mass along a non-vertical line, at least one guide may be used, such as a guide rail.

The force generating device may be embodied in various ways. It may be passive or active. Generally, a low-mass, high-force device is preferred. The force generating device may have a distance and/or an orientation and/or an angle of rotation between its first terminal and second terminal which is/are changed during its operation. The force generating device may provide a constant or a varying force during its operation.

In a preferred embodiment, the force generating device is a spring, in particular a linear spring or a spiral spring, such as springs made from a flexible and resilient material, e.g. in a wound configuration. In the case of a spiral spring, the second moment generated by the spiral spring may be thought to be generated by a force exerted at a second distance. The spring may also be a gas spring, such as a piston-cylinder unit comprising a closed volume of gas, such as an inert gas, air or the like. The force generating device may also be an actuator, such as an electric, piezo-electric, magnetic, magneto-restrictive, electromagnetic, electromechanical, pneumatic or hydraulic actuator, or an actuator based on any combination of such principles, possibly controlled by a control signal generated on the basis of the angular position of the balancing device, the position of the basic mass, and/or the position of the first terminal of the force generating device.

The reference position connected to the second terminal of the force generating device may be fixed to e.g. a frame in which also the axis of rotation of the balancing device is mounted. However, the reference position may also be movable, either passively or actively, and/or in a controlled way, e.g. at right angles to the force In an aspect of the gravity compensation device according to the invention, the first predetermined distance is kept constant for different angular positions of the balancing device, and the second predetermined distance decreases when a force generated by the force generating device increases by a rotation of the balancing device, whereas the second predetermined distance increases when the force generated by the force generating device decreases by a counter-rotation of the balancing device. An advantage of this embodiment is that the first moment relative to the axis of rotation of the balancing device in a first rotational direction may be kept constant, and a path of the basic mass may be made to extend along a vertical line without guiding the basic mass along guides.

In a further aspect of the gravity compensation device according to the invention, the second predetermined distance is kept constant for different angular positions of the balancing device, and the first predetermined distance increases when a force generated by the force generating device increases by a rotation of the balancing device, whereas the first predetermined distance decreases when the force generated by the force generating device decreases by a counter-rotation of the balancing device. An advantage of this embodiment is that the first terminal and the second terminal of the force generating device may be situated on the same line over the entire operating range of the force generating device.

In a preferred embodiment of the gravity compensation device according to the invention, the balancing device comprises a pulley having an, at least partially, angle-variable radius. Some advantages of this configuration are the simplicity of design, its low cost and its low mass, in particular when the pulley is made of a low density material, such as a synthetic material. Depending on the nature and design of the force generating device, the radius of the pulley may be configured such that for every orientation of the pulley a predetermined gravity compensation, such as a complete gravity compensation, of the basic mass is obtained. More specifically, the balancing device preferably comprises an essentially circular-shaped first pulley, and a second pulley having an, at least partially, angle-variable radius. The first pulley may be a standard size wheel, which is fixed to the second pulley, both pulleys having the same axis of rotation.

In a preferred embodiment of the gravity compensation device according to the invention, either the connection between the basic mass and the balancing device, or the connection between the first terminal of the force generating device and the balancing device, or both connections, is/are provided by a flexible wire. Advantages of such an embodiment are the low cost and the low mass of the wire, adding virtually no extra mass to the gravity compensation device, yet providing a simple and reliable connecting means. It will be clear that the term wire is to include similar connecting means like a rope, a cable, a snare, a string, a belt, a chain, etc.

Bearing the above in mind, in a preferred embodiment of the gravity compensation device according to the invention, the balancing device comprises a pulley with an angle-variable radius, the connection between the basic mass and the balancing device and the connection between the first terminal of the force generating device and the balancing device being provided by a flexible wire, and the wire being guided along the outer circumference of the pulley. In another preferred embodiment of the gravity compensation device according to the invention, the balancing device comprises an essentially circular-shaped first pulley, and a second pulley with an angle-variable radius, the connection between the basic mass and the balancing device being provided by a first flexible wire, and the connection between the first terminal of the force generating device and the balancing device being provided by a second flexible wire, wherein one of the first and second wires is guided along the outer circumference of one of the first and second pulleys, and the other of the first and second wires is guided along the outer circumference of the other of the first and second pulleys.

Although the wire may be slidable relative to the outer circumference of the pulley or pulleys (where the pulley or pulleys are rotated, possibly in a controlled way, depending on the position of the basic mass), preference is given to an embodiment of the gravity compensation device according to the invention, wherein the wire is fixed to the balancing device at a point near its circumference. In the latter case the wire essentially does not slide relative to the outer circumference of the pulley or pulleys during a rotation thereof.

The gravity compensation device according to the invention may comprise one or more pulleys, as exemplified above, but may also comprise one or more balancing arms or other means capable of generating a first and a second moment on the balancing device. Different means may be used in combination with each other, such as a balancing arm fixed to a pulley. In a preferred embodiment, the balancing device comprises a first arm connected to the basic mass at a first point of connection, and a second arm fixed to the first arm and connected to the first terminal of the force generating device at a second point of connection, the first and second points of connection being selectable along the first and second arms, respectively. In particular, at least one of the points of connection may be movable, more specifically slidable, along its associated arm.

The gravity compensation device according to the present invention may be used in a variety of applications including, but not limited to, pick-up or handling or transfer or placing apparatus, e.g. for electronic components, bonding apparatus, wafer table handling devices, and various other applications.

The claims and advantages of the present invention will be more readily appreciated as the same becomes better understood by reference to the following detailed description of exemplary, non-limiting embodiments, when considered in connection with the accompanying drawings.

FIG. 1A schematically illustrates an embodiment of a gravity compensation device according to the invention.

FIG. 1B shows the device of FIG. 1a in a different operating position.

FIG. 1C illustrates an alternative embodiment of the device of FIG. 1a.

FIG. 2A schematically illustrates another embodiment of the gravity compensation device according to the invention.

FIG. 2B shows the device of FIG. 2a in a different operating position.

FIG. 2C illustrates an alternative embodiment of the device of FIG. 2a.

FIG. 3 schematically illustrates still another embodiment of the gravity compensation device according to the invention.

FIG. 4 schematically illustrates yet another embodiment of the gravity compensation device according to the invention.

FIG. 5 schematically illustrates a further embodiment of the gravity compensation device according to the invention.

Figure 6:
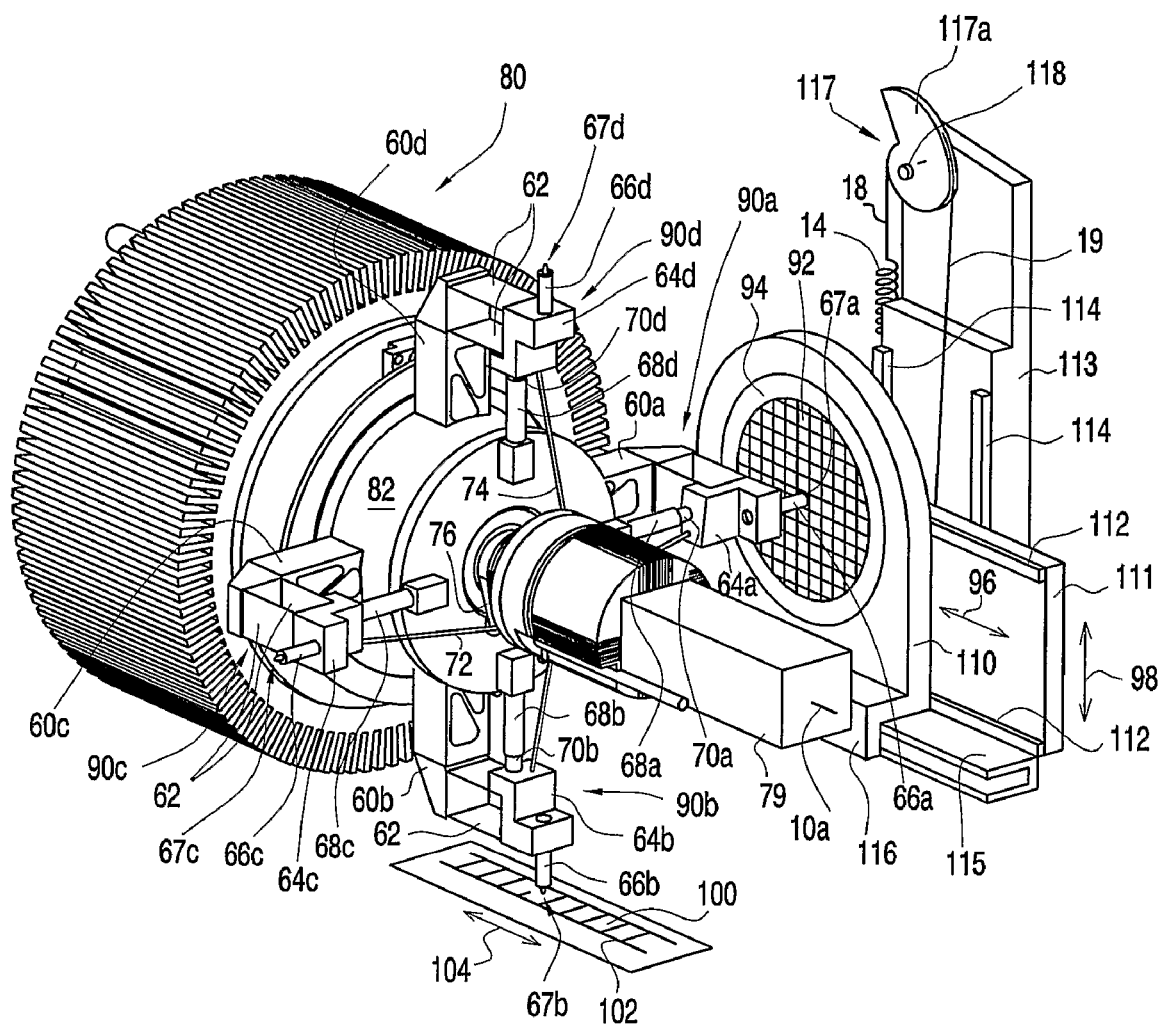

FIG. 6 shows a perspective view of a gravity compensation device as used in conjunction with a chip transfer apparatus.

Figure 7:
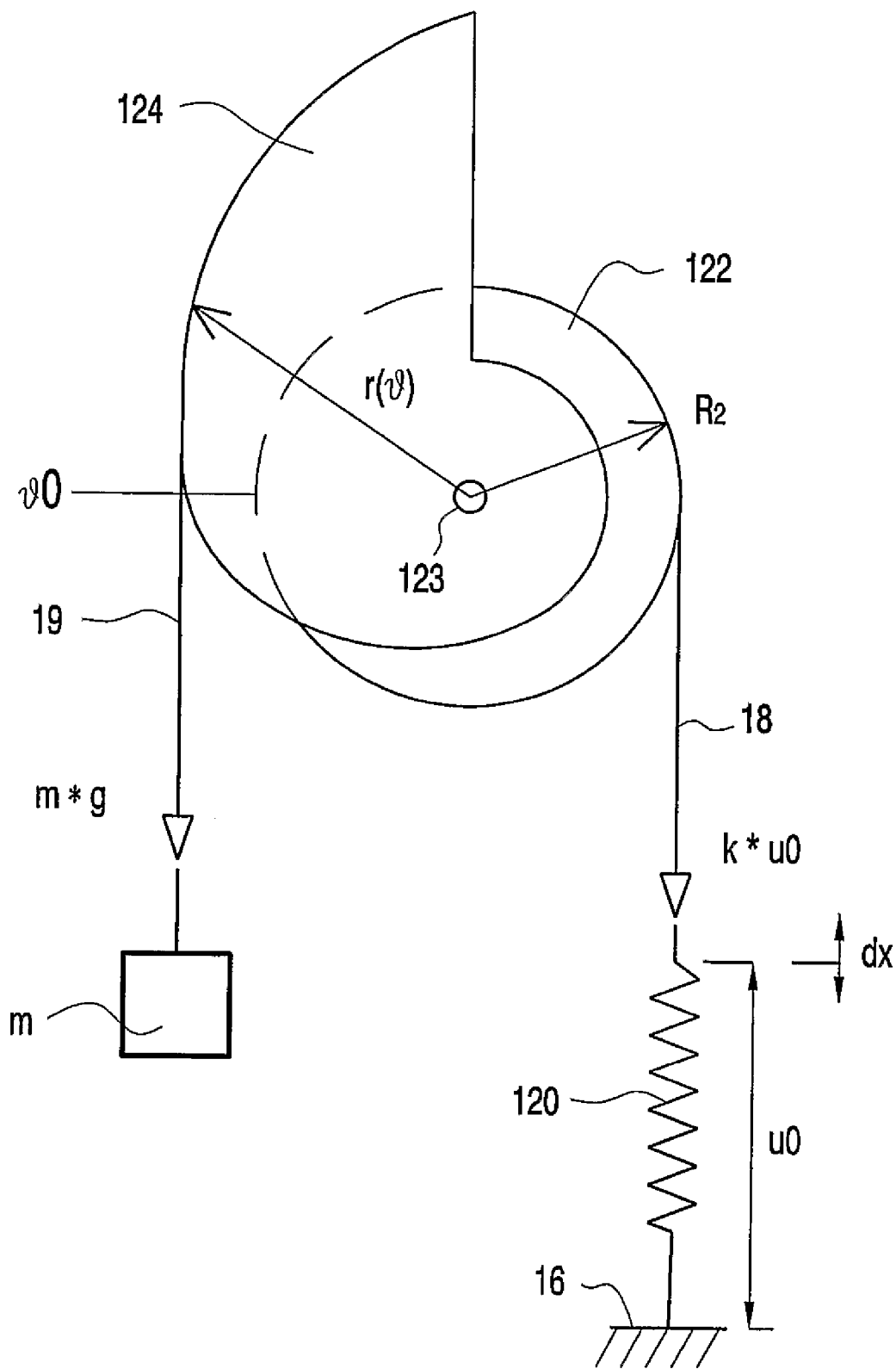

FIG. 7 shows a schematic drawing used to illustrate a calculation of a varying radius of a pulley in a gravity compensation device according to the invention.

In the different Figures, the same reference numerals relate to the same or similar components or to components having the same or similar functions.

FIGS. 1a and 1b illustrate a mass 10, having a force of gravity acting on it in a direction which is indicated with an arrow 11. A balancing device 12 is rotatable around an axis 13. A linear spring 14 has a terminal 15 connected to a reference position 16, e.g. on a frame relative to which the mass 10 is to be moved. The position of the axis 13 may be fixed relative to the reference position 16. An opposite terminal 17 of the spring 14 is connected to the balancing device 12 through a wire 18 or other flexible connecting element such as a rope, a cable, a snare, a string, a belt, a chain, etc., but also through any inflexible connecting element being an arbitrarily shaped inflexible body. For brevity, herein the word 'wire' will be used to indicate all kinds of connecting elements, which may be flexible where appropriate (only transmitting pulling forces), or which may be inflexible where appropriate (transmitting either pulling or pressure forces). A similar wire 19 is used to connect the mass 10 to the balancing device 12.

The balancing device 12 may be a flat, pulley-like element. It has a circumference with a radius (when seen relative to the axis 13) which varies along the circumference. In an area indicated with a I, delimited with broken lines, the radius has a constant, predetermined value. In an area indicated with a II, delimited with broken lines, the radius decreases, seen in a clockwise direction, at a predetermined rate. The balancing device 12 is provided with a groove along its circumference accommodating the wires 18 and 19. The wire 18 may also be the same as the wire 19, thus forming a unitary wire connecting the terminal 17 of the spring 14 with the mass 10 via the groove of the balancing device 12. A provision is made to ensure that the portions of the wires 18, 19 contacting the balancing device 12 in its groove do not move relative to the groove. As an example, the wires 18 and 19 may be provided with thickened end stops engaging in corresponding recesses 18a, 19a along the groove. As another example, the wires 18 and 19 may be fixed by clamping or screwing to the balancing device 12. As a further example, the combination of wire and groove may also be designed such that sufficient friction is generated to avoid any sliding of the wires 18 and 19 or the unitary wire relative to the groove.

Preferably, the mass of the balancing device 12 and the wires 18, 19 is as low as possible. For this purpose, the wire may be made of a low density, high strength material, such as an aramide material. The wire may also be a metal cable. The balancing device 12 may be made from metal or from a synthetic material. For a further weight reduction, the balancing device 12 may be provided with (possibly integral) spokes (not shown) connecting an outer circumferential portion of the balancing device 12 with an inner hub portion near the axis 13 of the balancing device 12.

In FIG. 1b, the mass 10 has been moved from the position shown in FIG. 1a to the position shown in FIG. 1b by an actuator not shown in detail. Accordingly, the balancing device 12 has been rotated counterclockwise through an angle of 90°, and the distance between the terminals 15 and 17 of the spring 14 has been decreased. In the rotation of the balancing device 12, the distance between the point of engagement of the force exerted by the spring 14 through the wire 18 on the balancing device 12, and the axis 13 has remained the same due to the radius of the balancing device 12 being constant in the area I. However, the force exerted by the spring 14 on the balancing device 12 has decreased during the rotation of the balancing device 12.

In the counterclockwise rotation of the balancing device 12, the distance between the point of engagement of the force of gravity exerted by the mass 10 through the wire 19 on the balancing device 12, and the axis 13 has decreased due to the radius of the balancing device 12 being decreased in the area II. However, the force exerted by the mass 10 on the balancing device 12 has remained constant during the rotation of the balancing device 12.

Consequently, when comparing the situation depicted in FIG. 1a with the situation depicted in FIG. 1b, going from FIG. 1a to FIG. 1b the moment exerted by the spring 14 on the balancing device 12 in the counterclockwise direction is decreased. At the same time, also the moment exerted by the mass 10 on the balancing device 12 in the clockwise direction is decreased. It will be clear that with a suitable design of the shape of the circumference of the balancing device 12 in the area II, in any position of the mass 10 in the range from the FIG. 1a position to the FIG. 1b position, the mass 10 may be partially or fully gravity compensated.

FIG. 1c illustrates the possibility to interchange the position of the mass 10 and the spring 14 in the construction shown in FIG. 1a. When rotating the balancing device 12 from the position shown in FIG. 1c in a counterclockwise direction through an angle of 90°, the moment exerted by the mass 10 on the balancing device 12 in the counterclockwise direction remains the same, whereas also the moment exerted by the spring 14 on the balancing device 12 in the clockwise direction remains the same, since the spring force will increase and the radius of the balancing device 12 may be made to decrease accordingly. A choice between the configuration of FIG. 1a and the configuration of FIG. 1c may e.g. be made while considering the desired path of movement of the mass 10 when the mass 10 is freely suspended from the wire 19: according to FIGS. 1a and 1b this path runs along a non-vertical line, while according to FIG. 1c this path will follow a vertical line. It will, however, be clear that the mass 10 may be made to move along any straight or curved path, as long as this path has a vertical component, in any of the FIGS. 1a, 1b and 1c.

An actuator (not shown in detail) for moving the mass 10 from one position to another, lower or higher, position may be of any construction, and may in the embodiment of FIGS. 1a-1c engage on the mass 10, the balancing device 12, the axis 13, the spring 14, the wire 18, or the wire 19. The actuator may be any type of actuator, such as an electromagnetic, a piezoelectric, a hydraulic, a pneumatic or a mechanical type of actuator.

Further, with reference to FIGS. 1a, 1b and 1c it is noted that in case the wires 18 and 19 are part of one and the same wire, only one stop engaging in one recess 18a, 19a would be needed, the stop being fixed to the wire. It is also possible to omit any stop, and to make the wire slidable along the circumference of the balancing device 12. In that case an angular position of the balancing device 12 could be set by an actuator controlled by e.g. the position of the mass 10 or the position of the terminal 17 of the spring 14 in order to synchronize the movement of the wire with the movement of the balancing device 12.

FIGS. 2a and 2b show a similar configuration as FIGS. 1a and 1b, with this difference that the balancing device 12 of FIGS. 1a and 1b is substituted by separate balancing subdevices 12a and 12b situated next to each other, and connected to each other, and having a common axis 13. The balancing subdevice 12a is circular-shaped, and comprises a circumferential groove with a recess 18a. The balancing subdevice 12b is essentially half-moon-shaped, and comprises a circumferential groove along its curved portion. The wires 18, 19 have thickened end portions accommodated in respective recesses 18a, 19a of the respective balancing subdevices 12a, 12b.

The balancing subdevices 12a, 12b being connected to each other, the embodiment of the gravity compensation device according to FIGS. 2a and 2b functions essentially the same as the gravity compensation device according to FIGS. 1a and 1b. Like in FIG. 1c, FIG. 2c illustrates the optional configuration in which the position of the mass 10 and the spring 14 have been interchanged when compared to FIG. 2a.

FIG. 3 illustrates a gravity compensation device in which a spiral-shaped spring 30 (indicated with dash-dotted lines) is connected at one terminal 31 to a balancing device 32, and at another terminal 33 to a reference position 34. The balancing device 32 is rotatable around an axis 35. A wire 36 connects a mass 10 to the balancing device 32. The balancing device 32 has a circumference with a radius which (when seen relative to the axis 35) varies along the circumference. In an area delimited with broken lines, and indicated with a I, the radius decreases, when seen in a clockwise direction, at a predetermined rate. The balancing device 32 is provided with a groove along its circumference accommodating the wire 36. The wire 36 is provided with a thickened end portion engaging in a corresponding recess 37 along the groove.

When the mass 10 is lowered from the position shown in FIG. 3, the moment which the mass 10 exerts on the balancing device 32 increases due to the increasing radius at the point where the wire 36 engages the balancing device 32. At the same time, the moment exerted by the spring 30 on the balancing device 32 in the opposite direction will increase. It will be clear that with an appropriate design of the curvature of the balancing device 32, the force of gravity acting on the mass 10 may thus remain partially or fully compensated by the spring force, although the spring force increases.

When the mass 10 is lifted from the position shown in FIG. 3, the moment which the mass 10 exerts on the balancing device 32 decreases due to the decreasing radius at the point where the wire 36 engages on the balancing device 32. At the same time, the moment exerted by the spring 30 on the balancing device 32 in the opposite direction will decrease. Thus, also in such a movement the gravity compensation of the mass 10 may be retained.

FIG. 4 shows a balancing device 40 comprising a balancing arm 41 and a balancing subdevice 42 connected to the balancing arm 41, both being pivotable relative to an axis of rotation 43. The circumference of the balancing subdevice 42 has a radius which, when seen relative to the axis 43, decreases in a clockwise direction, at a predetermined rate in an area delimited with broken lines, and indicated with a I. The balancing device is provided with a groove along its circumference accommodating a wire 44 connecting a spring 45 to the balancing subdevice 42. The wire 44 is provided with a thickened end portion 46 engaging in a corresponding recess along the groove. A mass 10 is connected to the balancing arm 41 by a wire 47.

When the mass 10 is lowered from the position shown in FIG. 4, the moment which the mass 10 exerts on the balancing device 40 decreases due to the decreasing distance of the working line of the force exerted by the mass 10 on the balancing arm 41 relative to the axis of rotation 43. At the same time, the force exerted by the spring 45 through the wire 44 on the balancing device 40 in the opposite direction will increase.

When the mass 10 is lifted from the position shown in FIG. 4, the moment which the mass 10 exerts on the balancing device 40 again decreases due to the decreasing distance of the working line of the force exerted by the mass 10 on the balancing arm 41 relative to the axis of rotation 43. At the same time, the force exerted by the spring 45 through the wire 44 on the balancing device 40 in the opposite direction will decrease.

It will be clear that with an appropriate design of the curvature of the balancing subdevice 42, the force of gravity acting on the mass 10 may thus remain partially or fully compensated by the force generated by the spring 45.

FIG. 5 shows a balancing device 50 comprising a first balancing arm 51 and a second balancing arm 52 connected to the first balancing arm 51, both being pivotable relative to an axis of rotation 53. The first balancing arm 51 is connected to a spring 54 through a wire 55. A mass 10 is connected to the second balancing arm 52 at a point of connection 56 through a wire 57. The point of connection 56 is slidable along the second balancing arm 52 in either of the opposite directions indicated by a double arrow. The point of connection 56 is guided between guides 58, 59 such that when the second balancing arm 52 pivots in the counter-clockwise direction, the point of connection 56 moves away from the axis of rotation 53, thus increasing the moment exerted by the mass 10 on the balancing device 50 in the counter-clockwise direction. At the same time, the first balancing arm 51 will also pivot in the counter-clockwise direction, increasing the force exerted by the spring 54 on the first balancing arm 51, and thus increasing the moment exerted by the spring 54 on the balancing device 50 in the clockwise direction.

On the other hand, when the second balancing arm 52 pivots in the clockwise direction, the point of connection 56 moves towards the axis of rotation 53, thus decreasing the moment exerted by the mass 10 on the balancing device 50 in the counter-clockwise direction. At the same time, the first balancing arm 51 will also pivot in the clockwise direction, decreasing the force exerted by the spring 54 on the first balancing arm 51, and thus decreasing the moment exerted by the spring 54 on the balancing device 50 in the clockwise direction.

It will be clear that with an appropriate design of the (curvature of the) guides 58, 59, the force of gravity acting on the mass 10 may thus remain partially or fully compensated by the force generated by the spring 54.

FIG. 6 shows a chip transferring apparatus 80 comprising four transfer heads 90a, 90b, 90c and 90d mounted on a rotatable transfer assembly 82. The rotatable transfer assembly 82 is adapted to rotate about the axis 10a, driven by a first motor (not shown in FIG. 6). The angle between adjacent transfer heads 90a-90d is 90°. A surface of a chip 92 being part of a wafer 94 may be positioned opposite a transfer head 90a-90d in a chip pick-up position by moving the wafer 94 (to be more precise: its carrier film to which the chips 92 are non-permanently adhered) in any of the directions of double arrows 96, 98, as will be elucidated below. A bond surface of a lead frame 100 being part of a lead frame string or other lead frame assembly 102 may be positioned opposite a transfer head 90a-90d in a chip bonding position by moving the lead frame assembly 102 in either one of the directions of double arrow 104 by positioning means which are known per se, and are not shown in detail.

The rotating assembly 82 is adapted to be indexed in index steps of 90° about the axis 10a, either clockwise (e.g. the transfer head 90a moving to the position in which the transfer head 90b is shown in FIG. 6) or counter-clockwise (e.g. the transfer head 90d moving to the position in which the transfer head 90c is shown in FIG. 6). In the clockwise index direction, a chip 92 picked up from the wafer 94 by the transfer head 90a in its position shown in FIG. 6, is bonded to a lead frame 100 after one index step, when the transfer head 90a is in the position shown for transfer head 90b in FIG. 6. In the counter-clockwise index direction, a chip 92 picked up from the wafer 94 by the transfer head 90a in its position shown in FIG. 6, is bonded to a lead frame 100 after three index steps, when the transfer head 90a is in the position shown for transfer head 90b in FIG. 6. Whichever index direction is chosen, every consecutive index step can be useful in transferring a chip 92 from the wafer 94 to the lead frame assembly 102. A difference between the clockwise and the counter-clockwise index direction is that in the counter-clockwise index direction the transfer heads in the positions of the transfer heads 90c and 90d carry a chip 92, whereas in the clockwise index direction they do not. Thus, in the counter-clockwise index direction e.g. an inspection of the position of a chip 92 relative to the transfer head, or an inspection of the structure of the chip 92 on its side formerly facing the carrier film, or any other processing step of the chip 92 can be performed in any of the positions shown for the transfer heads 90c and 90d in FIG. 6.

Each transfer head 90a-90d comprises an arm 60a-60d, respectively, extending essentially radially at right angles to the axis 10a from the rotating assembly 82. The arms 60a-60d have been provided with holes to reduce their weight. Near the free ends of each of the arms 60a-60d, the ends of a pair of parallel leaf springs 62 are fixedly mounted, while opposite ends of the pair of leaf springs 62 support blocks 64a-64d, respectively. In each block 64a-64d a collet 66a-66d, respectively, with pick-up openings 67a-67d, respectively, is fixedly mounted. Each collet 66a-66d is movable to and fro over a short distance essentially in the radial direction at right angles to the axis 10a. Each transfer head 90a-90d further comprises an arm 68a-68d, respectively, extending essentially radially at right angles to the axis 10a from the rotating assembly 82. Pressure springs 70a-70d are mounted between the ends of the arms 68a-68d and the respective blocks 64a-64d.

The block 64a is connected to the block 64c by a wire 72, while the block 64b is connected to the block 64d by a wire 74. In its center part, the wire 72 is fixedly connected, e.g. clamped, to a lever 76 which in turn is fixedly connected to coupling parts supported by bearings. The coupling parts are fixedly connected to a rotatable shaft driven by a motor 79. In its center part, the wire 74 is fixedly connected, e.g. clamped, to a lever which in turn is fixedly connected to coupling parts supported by bearings. The coupling parts are fixedly connected to a rotatable shaft driven by a second motor accommodated in a hollow space inside the first motor. Lever 76 and the other lever connected to the first and second motor, respectively, can be driven independently of each other, and independently of the first motor, about the axis 10a. The wires 72 and 74 are pretensioned by the springs 70a, 70c and 70b, 70d, respectively. The pretension force should at least be maintained at a value above the bonding force to be applied on a chip 92 on a lead frame 100 by the collet of a transfer head in the position of transfer head 90b in FIG. 6.

During rotation of the rotating assembly 82 by the motor (not shown), the lever 76 and the other lever are driven at the same rotational speed by their respective motors to keep the blocks 64a-64d in a predetermined radial position relative to the axis 10a. For speed and angular position control, the respective motors are provided with suitable incremental measuring systems known per se, and not shown in the drawings. Since two opposite blocks 64a, 64c and 64b, 64d are connected with each other by the wires 72 and 74, respectively, any centrifugal forces during rotation of the rotating assembly 82 are compensated, and need not be generated by the motors. The blocks 64a-64d can be displaced radially inward or outward by creating a difference in angular position between the shaft of the first motor and any of the shafts of the other motors. By choosing the stiffness of the springs 70a-70d to be low, the pretension force can be kept relatively constant during a displacement of any of the blocks 64a-64d, which force is to be generated by the motors. No drives for moving the blocks 64a-64d need be mounted on the rotating assembly 82 itself, and consequently no power supply from the stationary environment of the transferring apparatus 80 to the rotating assembly 82 is necessary, keeping the structure simple and lightweight.

The wafer 94 is fixed to a wafer fixing device 110 which can be made to move in the directions of the double arrow 96 relative to a table 111 along guide rails 112 mounted thereon. The table 111 can be made to move in the directions of the double arrow 98 relative to a frame 113 along guide rails 114 mounted thereon. The movement of the wafer fixing device 110 in the directions of the double arrow 96 is controlled by a linear motor having a stator 115 connected to the table 111, and a rotor 116 connected to the wafer fixing device 110. The movement of the table 11 in the directions of the double arrow 98 is controlled by a similar configuration (not shown in detail).

On the frame 113, a balancing device 117 is mounted, having an axis of rotation 118. The balancing device 117 comprises a balancing subdevice 117a in the form of a pulley with an angle-varying radius, and a balancing subdevice (not shown) in the form of a pulley with a constant radius, located behind the balancing subdevice 117a. The balancing subdevice 117a is connected to the table 111 by a wire 19 at a position (not shown) between the table 111 and the frame 113. The balancing subdevice is connected to a first terminal of a spring 14 by a wire 18. A second terminal of the spring 14 is connected to the frame 113 at a position (not shown) behind the table 111. The gravity compensation provided by the balancing device 117 and the spring 14 has been described above with reference to FIGS. 2a, 2b, where the reference position 16 (FIGS. 2a, 2b) is located on the frame 113 (FIG. 6), and the mass 10 (FIGS. 2a, 2b) comprises the table 111, the wafer fixing device 110 and the wafer 94 (FIG. 6).

By way of example, a calculation method for determining a varying radius of a pulley in a gravity compensation device according to the invention will be illustrated by reference to a model depicted in FIG. 7.

In FIG. 7, it is assumed that a spring 120 with a spring constant k is connected to a first pulley 122 with a constant radius R2, which is rotatable around an axis of rotation 123. A second pulley 124 with a varying radius $r(\theta)$ carries a mass m. The second pulley 124 is fixed to the first pulley 122. In an initial situation of equilibrium, the spring 120 is stretched to a length u0. In this situation, the second pulley 124 has a radius $r(\theta 0)$. The following condition (1) is fulfilled:

$$R2*k*u0 = m*g*r(\theta 0) \quad (1)$$

where g represents the gravitational constant.

For any other angular position of the first and second pulleys 122, 124, the following equation (2) is valid:

$$m*g*r(\theta) = R2*k*(u0+dx) \quad (2)$$

where dx represents a small displacement.

Since:

$$dx = R2 * d\theta \quad (3)$$

and:

$$r(\theta) = r(\theta 0) + \partial r/\partial \theta * d\theta = r(\theta 0) + r'(\theta) * d\theta \quad (4)$$

it follows from equations (1) to (4) that:

$$r'(\theta) = (k*R2^2)/(m*g)$$

which determines a linearly varying radius $r(\theta)$ of the second pulley 124:

$$r(\theta) = r(\theta 0) + \theta*(k*R2^2)/(m*g) \quad (5)$$

Of course, when a spring with a non-linear spring constant k is used, the radius $r(\theta)$ is also non-linear. Generally, the relation $r(\theta)$ depends on the characteristics of the force generating device in question.

In the above explained exemplary embodiments of the invention, a force generating device has been illustrated in the form of a spring. Other kinds of passive or active force generating devices may also be used, such as an air spring, or an actuator of an arbitrary type.

As explained above, the invention provides a simple, low-cost, low-mass, reliable gravity compensation device.

While the invention has been described and illustrated in its preferred embodiments, it should be understood that departures may be made therefrom within the scope of the invention, which is not limited to the details disclosed herein. Further, in the above description as well as in the appended claims, 'comprising' is to be understood not to exclude other elements or steps, and 'a' or 'an' does not exclude a plurality. Moreover, any reference signs in the claims shall not be construed as limiting the scope of the invention.

The invention claimed is:

1. A chip transfer apparatus comprising a gravity compensation device for compensating at least part of the force of gravity acting on a basic mass, the device comprising:
    a balancing system, comprising:
        an axis of rotation
        a balancing device being rotatable around the axis of rotation and being configured to be connected to the basic mass at a first predetermined distance from the axis of rotation for generating a first moment relative to the axis of rotation in a first rotational direction;
        a force generating device having a first terminal configured to be connected to the balancing device at a second predetermined distance from the axis of rotation for generating a second moment relative to the axis of rotation in a second rotational direction opposite to the first direction, the force generating device having a second terminal configured to be connected to a reference position
    wherein for different angular positions of the balancing device, the first predetermined distance and the second predetermined distance are selected such that the first moment and the second moment have a predetermined relationship.

2. The chip transfer apparatus according to claim 1, wherein the first predetermined distance is kept constant for different angular positions of the balancing device and the second predetermined distance decreases when a force generated by the force generating device increases by a rotation of the balancing device, whereas the second predetermined distance increases when the force generated by the force generating device decreases by a counter-rotation of the balancing device.

3. The chip transfer apparatus according to claim 1, wherein the second predetermined distance is kept constant for different angular positions of the balancing device and the first predetermined distance increases when a force generated by the force generating device increases by a rotation of the balancing device, whereas the first predetermined distance decreases when the force generated by the force generating device decreases by a counter-rotation of the balancing device.

4. The chip transfer apparatus according to claim 1, wherein the balancing device comprises a pulley having an, at least partially, angle-variable radius.

5. The chip transfer apparatus according to claim 1, wherein the balancing device comprises an essentially circular-shaped first pulley, and a second pulley having an, at least partially, angle-variable radius least partially.

6. The chip transfer apparatus according to claim 1, wherein the connection between the basic mass and the balancing device is provided by a flexible wire.

7. The chip transfer apparatus according to claim 1, wherein the connection between the first terminal of the force generating device and the balancing device is provided by a flexible wire.

8. The chip transfer apparatus according to claim 1, wherein the balancing device comprises a pulley with an angle-variable radius, the connection between the basic mass and the balancing device and the connection between the first terminal of the force generating device and the balancing device being provided by a flexible wire and wherein the wire is guided along the outer circumference of the pulley.

9. The chip transfer apparatus according to claim 1, wherein the balancing device comprises an essentially circular-shaped first pulley and a second pulley with an angle-variable radius, the connection between the basic mass and the balancing device being provided by a first flexible wire and the connection between the first terminal of the force generating device and the balancing device being provided by a second flexible wire wherein one of the first and second wires is guided along the outer circumference of one of the first and second pulleys, and the other of the first and second wires is guided along the outer circumference of the other of the first and second pulleys.

10. The chip transfer apparatus according to claim 8, wherein the wire is fixed to the balancing device at a point near its circumference.

11. The chip transfer apparatus according to claim 1, wherein the balancing device comprises a first arm for connecting to the basic mass at a first point of connection the first point of connection being selectable along the first arm.

12. The chip transfer apparatus according to claim 11, wherein the balancing device comprises a second arm connected to the first terminal of the force generating device at a second point of connection, the second point of connection being selectable along the second arm.

13. The chip transfer apparatus according to claim 1, wherein the balancing device comprises a first arm connected to the basic mass at a first point of connection and a second arm fixed to the first arm and connected to the first terminal of the force generating device at a second point of connection, the first and second points of connection being selectable along the first and second arms, respectively.

14. The chip transfer apparatus according to claim 1, wherein the force generating device is a linear spring.

15. The chip transfer apparatus according to claim 1, wherein the force generating device is a spiral spring.

16. The chip transfer apparatus according to claim 1, wherein the force generating device is a gas spring.

17. The chip transfer apparatus according to claim 1, wherein the force generating device is an actuator.

18. A method of manufacturing an electronic device comprising the step of transferring an element from a wafer to a carrier, wherein use is made of the chip transfer apparatus according to claim 1.

* * * * *